(12) United States Patent
Ruehl et al.

(10) Patent No.: US 7,984,399 B1
(45) Date of Patent: Jul. 19, 2011

(54) SYSTEM AND METHOD FOR RANDOM DEFECT YIELD SIMULATION OF CHIP WITH BUILT-IN REDUNDANCY

(75) Inventors: Roland Ruehl, San Carlos, CA (US); Mathew Koshy, San Mateo, CA (US); Jonathan Fales, South Burlington, VT (US); Udayan Gumaste, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 423 days.

(21) Appl. No.: 11/965,681

(22) Filed: Dec. 27, 2007

(51) Int. Cl.
*G06F 17/50* (2006.01)
*G06F 9/455* (2006.01)

(52) U.S. Cl. ........ 716/106; 716/104; 716/105; 716/107; 716/111; 716/112; 702/127; 702/128; 702/129; 702/179; 702/180; 702/181; 714/703; 714/704; 714/705

(58) Field of Classification Search .................. 716/4–5, 716/104–107, 111–112; 702/127–129, 179–181; 714/703–705
See application file for complete search history.

(56) References Cited

U.S. PATENT DOCUMENTS

| 6,738,954 | B1 * | 5/2004 | Allen et al. ........................ 716/4 |
| 7,380,225 | B2 * | 5/2008 | Joshi et al. ....................... 716/56 |
| 7,506,282 | B2 * | 3/2009 | Adams et al. ..................... 716/4 |
| 7,508,697 | B1 * | 3/2009 | Mukhopadhyay et al. ... 365/154 |

OTHER PUBLICATIONS

Sharma et al., Yield Optimization of Modular and Redundant Multimegabit RAM's: A Study of Effectiveness of Coding Versus Static Redundancy Using the Center-Satelite Model, 1993, IEEE, pp. 546-558.*

Lu et al., Efficient Built-In Redundancy Analysis for Embedded Memories With 2-D Redundancy, Jan. 2006, IEEE, vol. 14, p. 34-42.*
Yield Learning Through Design Attribute Extraction, White Paper, PDF Solutions, Inc., Jan. 1996.
Ciplickas et al., Predictive Yield Modeling for Reconfigurable Memory Circuits, In Proc. 9th IEEE/SEMI 1998 Advanced Semiconductor Manufacturing Conference, (ASMC98), May 1998.
Ciplickas et al., IC Yield Prediction and Analysis Using Semi-Empirical Yield Models and Test Data, Proc. SPIE, vol. 4692, Jul. 2002.
Ciplickas et al., Advanced Yield Learning Through Predictive Micro-Yield Modeling, In Proc. 7th IEEE International Symposium on Semiconductor Manufacturing (ISSM98), May 1998.
Michalka et al., A Discussion of Yield Modeling with Defect Clustering, Circuit Repair, and Circuit Redundancy, IEEE Transactions on Semiconductor Manufacturing, vol. 1, No. 3, Aug. 1990.
Khare et al., Accurate estimation of Defect-Related Yield Loss in Reconfigurable VLSI circuits, IEEE Journal of Solid-state Circuits, vol. 28, No. 2, Feb. 1993.
Ramadan, Redundancy Yield Model for SRAMS, Intel Technology Journal, 4th Quarter, 1997.

* cited by examiner

*Primary Examiner* — Nghia M Doan
(74) *Attorney, Agent, or Firm* — Vista IP Law Group, LLP

(57) ABSTRACT

In random defect yield simulation, a specific defect size interacts with a specific physical design and has a calculated probability of failure associated with it. The failure model is in terms of probability of failure. It provides a solution to the random defect yield simulation problem of chips with a built-in redundancy scheme. The solution first defines the independent failure modes of the chip with a built-in redundancy scheme and efficiently models each mode. Then, it may accumulate the respective probability of failures according to the chip's architecture.

16 Claims, 8 Drawing Sheets

US 7,984,399 B1

SYSTEM AND METHOD FOR RANDOM DEFECT YIELD SIMULATION OF CHIP WITH BUILT-IN REDUNDANCY

FIELD OF THE INVENTION

The invention relates to Integrated Circuit (chip) design.

BACKGROUND

Random defect yield analysis of a semiconductor chip without a built-in redundancy scheme is complex, but straightforward. The failure model is the same for the entire chip. If a failure due to a random defect occurs anywhere on the chip, the chip fails. Therefore, every section of area on a chip without a built-in redundancy scheme directly impacts the yield simulation result.

A chip with a built-in redundancy scheme complicates the yield simulation because defects may not cause failures. An example is a memory chip. If a failure due to a random defect occurs in a region of the memory chip that has no redundancy, the chip fails. However, if a random defect occurs in a region of the memory chip that has a redundancy scheme, such as a single bit in the array, the chip does not necessarily fail. Therefore, the failure model for a chip with built-in redundancy is different and more complex due to the redundancy scheme.

The necessity of a different failure model for chips with specific circuits is analogous to the design rule check (DRC) landscape where there are specific design rules for specific regions or circuits. For example, there are specific design rules for electrostatic discharge (ESD) devices and systems, or SRAM array cells. In the same way, random defect yield simulation requires new failure models to accurately calculate a yield simulation result for chips with built-in redundancy schemes.

SUMMARY

Methods and systems for random defect yield simulation of Integrated Circuit (IC) chip with built-in redundancy allowing an IC chip designer to verify based on both the design rules and models.

In one embodiment, the independent failure modes of the IC chip with a built-in redundancy scheme is defined, and the IC chip is efficiently modeled with each mode. Then, the respective probability of failures according to the chip's architecture is accumulated.

In other embodiments, a method, apparatus or computer product including determining areas of defects for a layout design, wherein the layout design includes built-in redundancy. A simulation model having a plurality of modes to determine a random defect yield for the design is provided. The random defect yield for each mode of the design is calculated. Each mode the calculated random defect yield is stored.

In another embodiment, the layout design includes a memory array with redundant row and/or column.

In another embodiment, the simulation model further comprises a failure model for a periphery of the memory array.

In another embodiment, the simulation model further comprises a failure model for the array elements of the memory array.

In another embodiment, the simulation model further comprises a failure model for replaceable row circuits.

In another embodiment, the simulation model further comprises a failure model for replaceable column circuits.

DETAILED DESCRIPTION

The invention is directed to a method and system for random defect yield analysis of an integrated circuit (IC) chip with built-in redundancy. In random defect yield simulation, a specific defect size interacts with a specific physical design and has a calculated probability of failure associated with it. The failure model may be defined in terms of probability of failure of the chip. It provides a solution to the random defect yield simulation problem of chips with a built-in redundancy scheme. First, the solution defines the independent failure modes of the IC chip with a built-in redundancy scheme and efficiently models each mode. Then, accumulate the respective probability of failures according to the chip's architecture. In some embodiments, the solution may be provided in the context of a generic memory chip with built-in redundancy. In other embodiments, the solution may be provided in the context of a generic IC chip with built-in redundancy.

Figure 1:
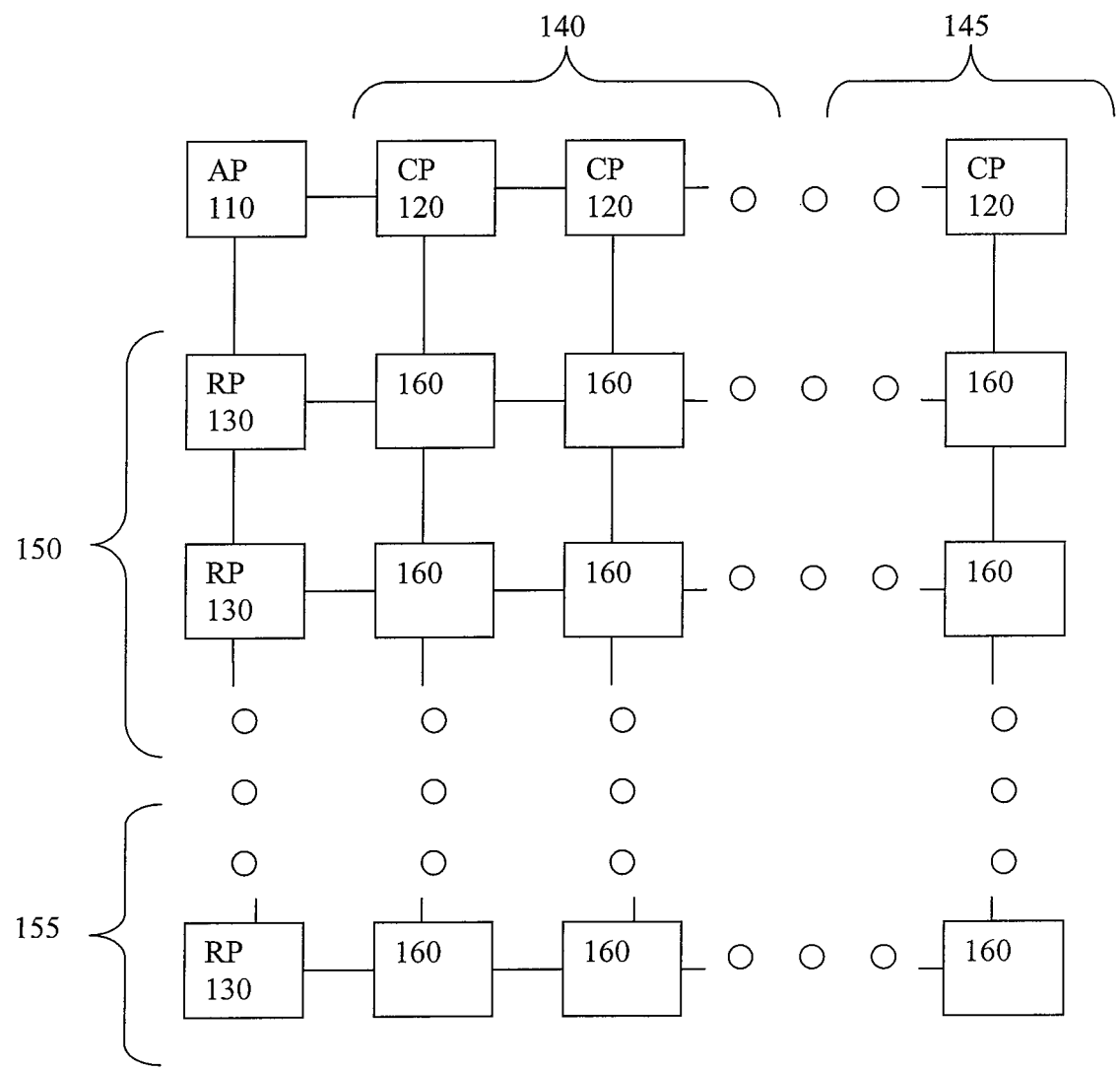
FIG. 1 illustrates a diagram of a memory array with redundancy according to an embodiment of the invention.

FIG. 1 illustrates a diagram of a memory array 100 with redundancy according to an embodiment of the invention. The memory array 100 could be part of a complex circuit design such as a big video processor or a central processing unit. The memory array could also be a portion of a memory chip. This exemplary memory array 100 could be incorporated into any IC design when needed.

The memory array 100 includes array periphery (AP) 110, column periphery (CP) 120, row periphery (RP) 130 and memory cells 160. The memory array also includes a plurality of rows 145 and columns 140 as well as a plurality of redundant rows 155 and columns 145. The rows 150 and columns 140 will be the dimension of the desired size. Additional redundant rows and columns are included to provide built-in redundancy for the design. A row or column is defective when one or more cells 160 or peripheries 120, 130 within it are defective. For every row and column having one or more defective cell, a redundant row and column will be used instead of the defective row and column.

The AP 110 includes logic that controls the memory array 100. The CP 120 includes logic that controls a respective column of cells 160. The RP 130 includes logic that controls a respective row of cells. Each cell is designed to store information such as bit value. The design and function of the memory array is well known in the art.

In one embodiment, there are two rows 150 and two columns 140. There are also redundant row 155 and redundant column 145. If any one of the rows 150 or columns 140 is defective, the defective row and column will be ignored by the array and the redundant row and column may be utilized by the array. This determination on which rows and/or columns may be used may be performed by the AP 110.

In another embodiment, location dependencies between defects and cells may be used to determine probability of failure. A defect may be caused by a particle such as a dust particle. If it may cause an unwanted short or open to the design. In another embodiment, the determination for defective cell includes determining the location of the defective component. By knowing the relationship of the defects to the design, corrective measures could be made.

Figure 2:
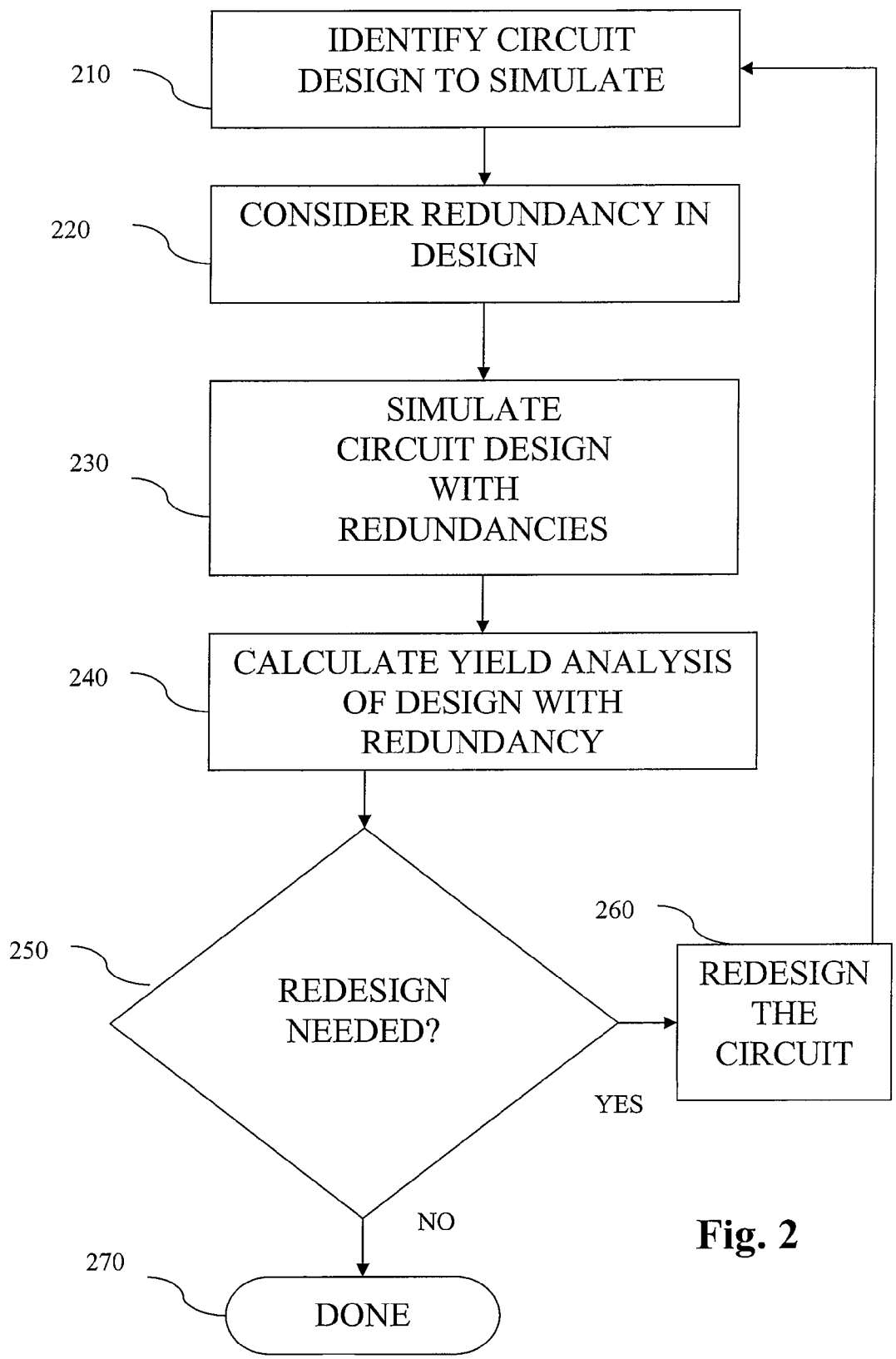
FIG. 2 depicts a flow diagram for improving yield according to an embodiment of the invention.

FIG. 2 depicts a flow diagram for improving yield according to an embodiment of the invention. The flow diagram 200 illustrates a process that includes simulating an IC chip design with built-in redundancies 230, calculating a yield for the design 240 and redesigning the memory 260 if necessary.

At 210, a circuit design that requires simulation is identified. The circuit design may be any IC chip with or without built-in redundancies. In one embodiment, the circuit may be a memory array circuit that is part of a larger IC chip design. In another embodiment, this circuit may be the whole IC chip design. The circuit design may be of any structure, block or portion of the IC chip design. Any design may be identified for simulation.

At 220, the design that is to be simulated is analyzed for redundancy circuitry within the design. In one embodiment, in the case of a memory array, redundant rows and/or columns may be identified. In another embodiment, redundancy of any type such as a device gate or macro may be added to the design. Any preliminary calculations or adjustments may be performed in an attempt to improve the simulation results.

At 230, the circuit design is simulated. In one embodiment, the memory array with built-in redundancies 100 is simulated. In other embodiments, other designs of memory arrays may be simulated. In further embodiments, any circuit designs with or without redundancy may be simulated. Simulations may use models and/or rules to determine possible hotspots. In some embodiments, the hotspots may be ignored because redundant column(s) and/or row(s) may be used after fabrication. Thus, in this case, the defects at the hotspots will not decrease the yield. However, if there are too many defects in the design, then the redundant column(s) and row(s) may no longer be able compensate for the defects. As a result, the yield of the design will decrease. For example, if a memory array only has one redundant row, and two rows of the memory array are defective, then the memory array will be defective.

At 240, the yield of the design with built in redundancy is calculated. The yield may be determined based on a failure model. Any probability calculation may be used with the failure model to determine the yield. In one embodiment, the probability of the failure for each row is calculated. In another embodiment, the probability of the failure for each column is calculated. In a further embodiment, the probability will include the probabilities of both the rows and columns. Any calculation of probability or yield of the rows/columns may be used.

At 250, a determination is made as to whether redesigning the identified circuit is needed. Using the calculated yield analysis of the design with redundancy, a decision is made as to whether a redesign of the circuit will result in a higher yield. If redesigning the circuit is desired, the process proceeds to 260. If improving the design of the circuit is not cost effective, impossible, or for any other reason undesirable, the process may stop at this point 270.

At 260, if necessary, the design of the circuit may be redesigned. In the embodiments of the memory with redundant rows and columns, one redesign may include the addition of more redundant rows and/or columns. In other embodiments, the problematic parts or the whole circuit may be redesigned to improve the yield. If redesign is necessary, the newly designed circuit may be simulated again at 210 in order to determine acceptable yield.

Figure 3:
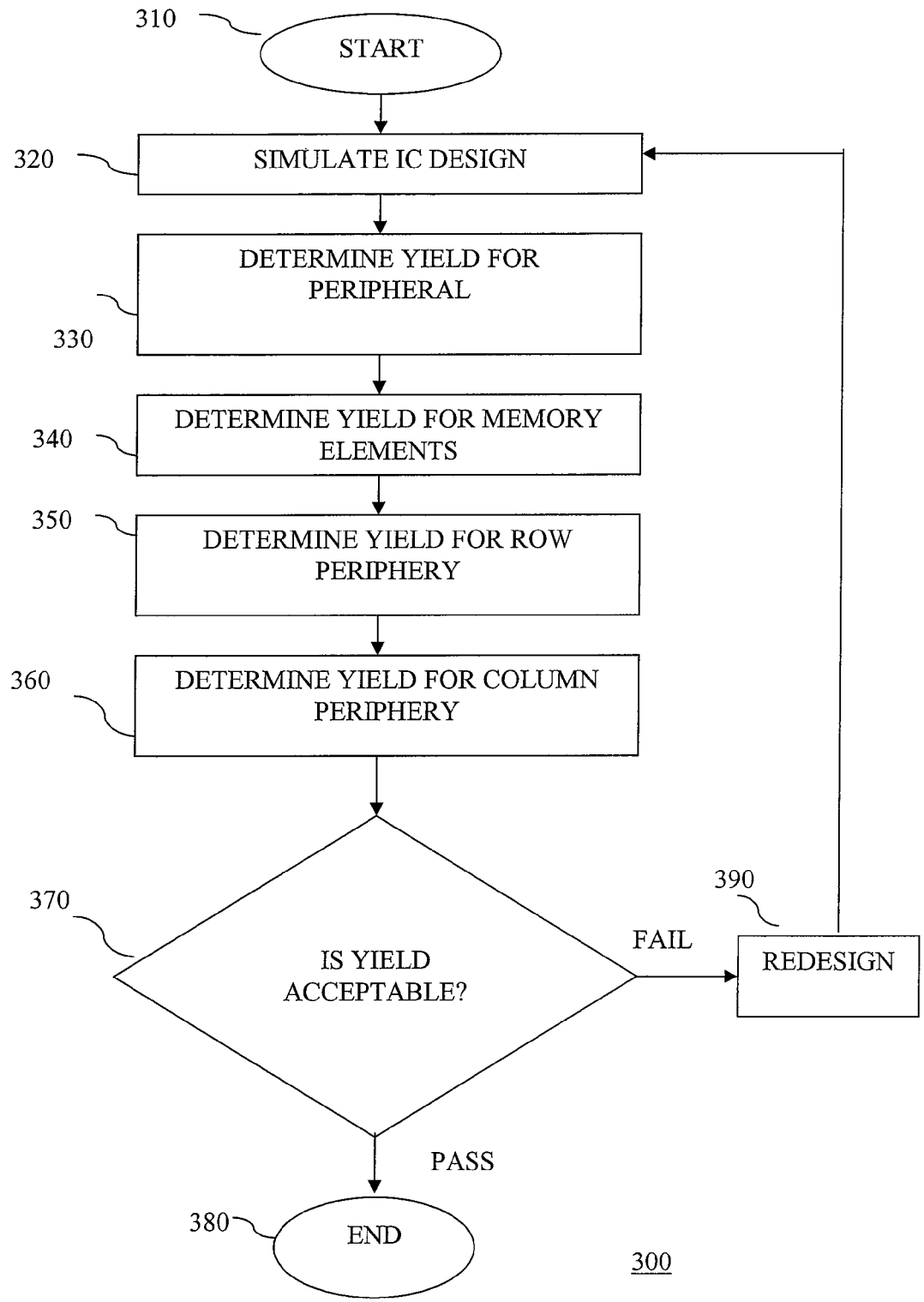
FIG. 3 depicts a flow diagram for determining yield according to an embodiment of the invention.

FIG. 3 depicts a flow diagram for determining yield according to an embodiment of the invention. The flow diagram 300 illustrates the process for designing the memory array of FIG. 1. The process includes simulating the design 320, determining the yield for different parts of the design 330, 340, 350, 360. Determining whether the yield is acceptable 370. If not, the circuit is redesigned 390.

At 310, the process starts. In one embodiment, the process starts at a user's request. In other embodiments, the process starts automatically during the simulation of the circuit design. This process may occur at any time when determining the yield of a circuit design is desired.

At 320, the circuit design for the IC chip is simulated. The simulation may be performed by any known conventional methods. The design may include one or more memory array similar to the one shown in FIG. 1. After the design for the IC chip is simulated, the yield for the memory array is determined.

At 330, a yield may be determined for the peripheral of the memory array. At 340, a yield may be determined for the memory elements of the memory array. At 350, a yield may be determined for the row peripherals, which may be, for example, row drivers. At 360, a yield may be determined for the column peripherals, which may be, for example sense amplifiers. Any model or combination of models may be used to determine the yield. In some embodiment, an array model may be used. In another embodiment, either one or more replaceable rows or replaceable columns are used to attempt to improve the yield. In another embodiment, one or more replaceable row and column model may be used. Any other models may also be used to determine the yield.

At 370, a determination is made as to whether the yield as determined above is an acceptable yield for the memory array. In some embodiments, redundant memory rows, columns and even arrays may be available to the IC chip design. However, other embodiments may require additional rows, columns or memory arrays in order to obtain acceptable calculated yield. If the yield is determined to be acceptable, the flow goes to 380. If the yield is unacceptable, the flow goes to 390.

At 380, the memory array has acceptable yield. The indication of acceptability may be stored. In some embodiments, another memory array or another part of the IC chip design may now be simulated.

At 390, the memory array has unacceptable yield. If this is the case, a redesign of the circuit may be required to improve the yield. In some embodiments, additional redundancy is included. In other embodiments, the whole circuit may be redesigned using the new models and/or rules from the simulation and calculations to try to improve the yield. Any methods may be used to try to improve the yield of the memory array.

Figure 4:
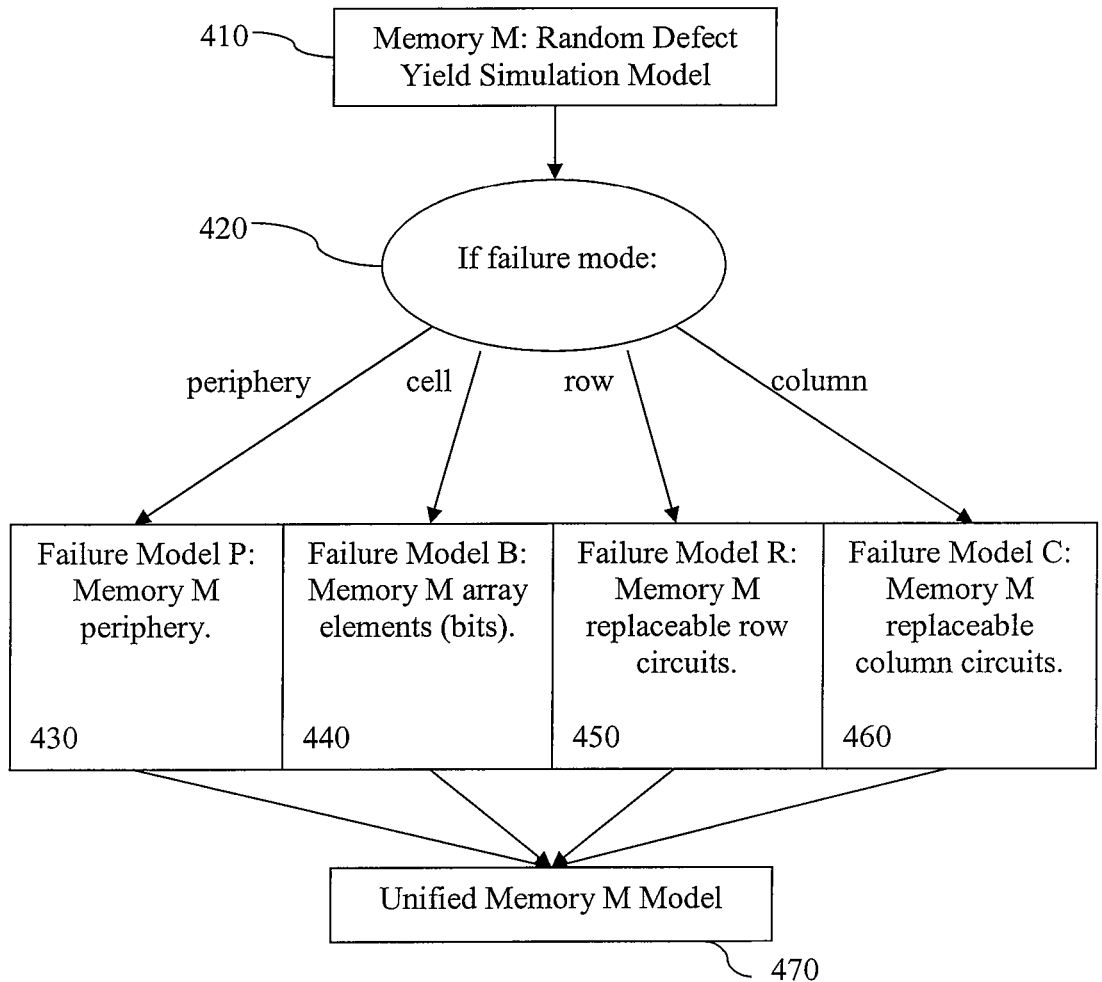
FIG. 4 depicts a flow diagram of a unified memory model according to an embodiment of the invention.

FIG. 4 depicts a flow diagram of a unified memory model according to an embodiment of the invention. FIG. 4 illustrates a diagram for New Random Defect Yield Simulation Model for Semiconductor Chips with Built-in Redundancy Schemes. In some embodiments, the failure model may be for a generic memory chip M 410.

The model determines if the memory has certain the failure modes. In some embodiments, the model has 4 failure modes 420: 1) A fail in the periphery P, 2) A fail in an array element B, 3) A fail in a row element R, and 4) A fail in a column element C.

If the failure is in the periphery 430, then the memory array will not work and the built in redundancy will not help in this situation. A failure in the periphery is straightforward; it results in a defective memory array as though it is a chip design without built-in redundancy. The memory chip redundancy scheme may possibly mitigate the other three faults. If the failure is in the array elements 440, another row and column may be used instead. A fail in an array element (bit) is fixable if the total number of array elements (bits) failing does not exceed the total number of redundant elements available. The row and column elements follow in like manner. If the failure mode is in the replaceable row circuits 450, another row may be chosen. If the failure mode is in the replaceable column circuits 460, another column may be chosen for the memory array. The model for all four of these modes, unified memory M model, may be utilized together to determine the yield of the memory.

Figure 5:
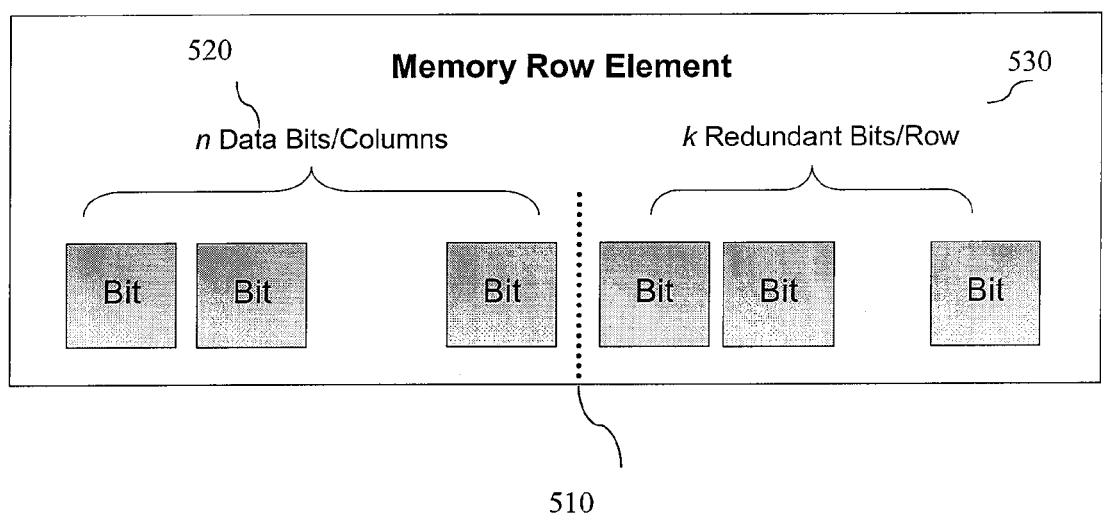
FIG. 5 illustrates a memory row element according to an embodiment of the invention.

FIG. 5 illustrates a memory row element according to an embodiment of the invention. Failure for the memory row element 500 may be analyzed using the array model. The array model calculates a probability of failure for the memory row element.

The memory row element includes a plurality of bits. Each bit belongs to a column. The bits are divided at 510 into n data bits/columns 520 and k redundant bits per row 530. A portion of the bits is data bits/columns. In some embodiments, there are n data bits/columns 520. The value n could be any number of columns that are designed to be part of the memory array. The other portion divided by 510 is the redundant bits of the row. In some embodiments, there are k redundant bits 530. The value k may be determined to best assist in improving the yield of the memory array at the cost of layout space on the chip.

The failure model for the array elements (440 in FIG. 4) begins with each bit, without redundancy. In the terminology of the binomial distribution, if the probability of failure (POF) of a single bit is $P_B$, an event corresponding to exactly i failures in an array of n bits is equal to that of i "successes" in a set of n Bernoulli trials, each with a probability of $P_B$. The probability $P_R^{(i)}$ that i single bit event(s) occur(s) and n−i single bit events do not occur for n bits in a row is given by the probability function:

$$P_R^i = \frac{n!}{i!(n-i)!} P_B^i (1-P_B)^{n-1} = \binom{n}{i} P_B^i (1-P_B)^{n-1}$$

In order to obtain the probability of all possible bit failures in a single row from i to n+k, the probabilities are summed. For example, if one bit in a row fails and if all the other bits in that row pass, that event has a probability $P_R^{(1)}$. Another event is if two bits in a row fail and all the other bits in that row pass, occurring with probability $P_R^{(2)}$. The sum of the probabilities of all such events corresponding to one or more bit failures is the total probability of any bit event in a single row.

$$P_R = \sum_{i=1}^{n} \frac{n!}{i!(n-i)!} P_B^i (1-P_B)^{n-1} = 1-(1-P_B)^n$$

The last expression in the above equation follows from the observation that the probability of no failures is $(1-P_R)$, which is also equal to $(1-P_B)^n$. This equation represents a failure model for a single row of bits without redundancy. If redundancy is added, $P_R=0$ until the bit failures exceed the number k of redundant bits. Substituting n=n+k and summing over all indices above k, the following row array element model which accounts for redundancy is obtained (see FIG. 5):

$$P_R = \sum_{i=k+1}^{n+k} \frac{(n+k)!}{i!((n+k)-i)!} P_B^i (1-P_B)^{n+k-1}$$

Figure 6:
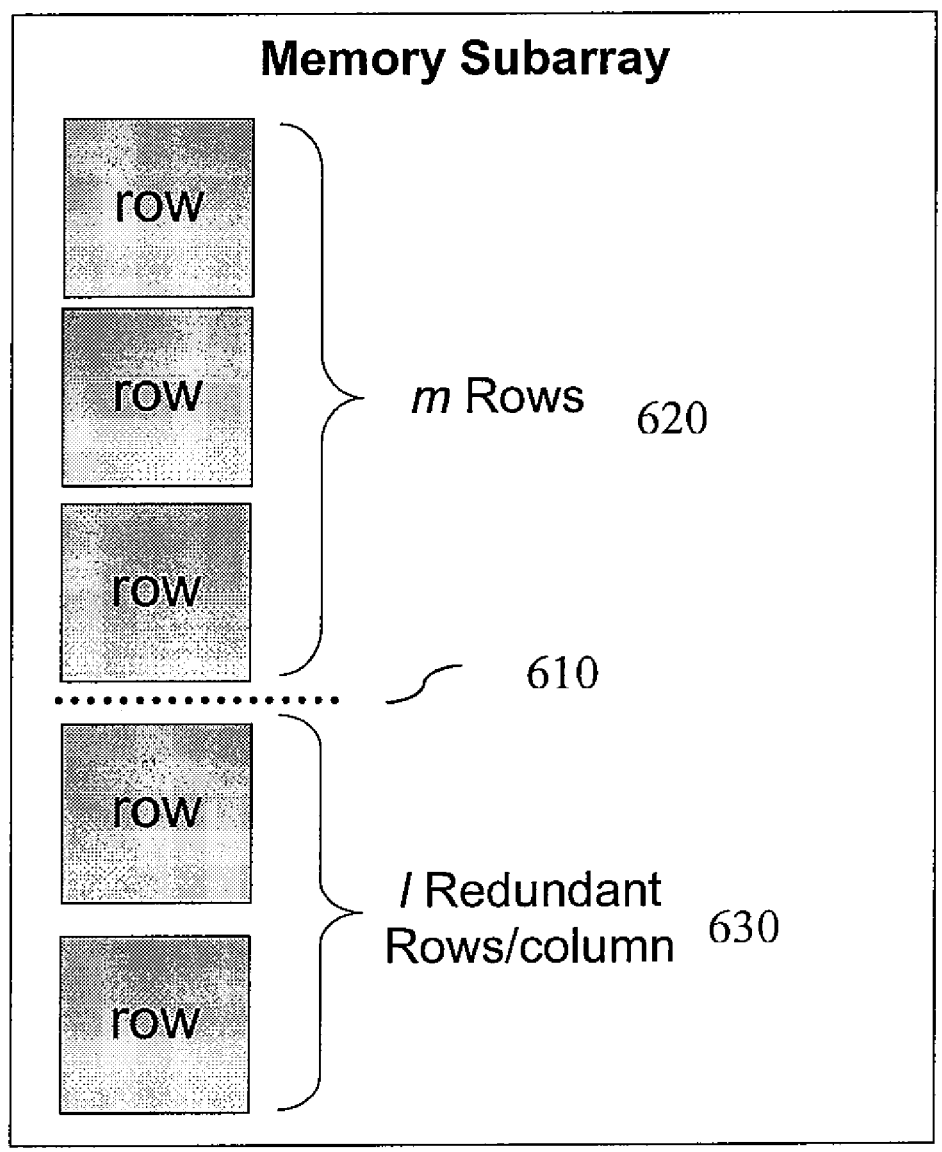
FIG. 6 illustrates a memory sub-array according to an embodiment of the invention.

FIG. 6 illustrates a memory sub-array according to an embodiment of the invention. Failure for the memory subarray 600 may be analyzed using the array model. The array model calculates a probability of failure for the memory subarray.

The memory subarray includes a plurality of rows. The rows are divided at 610 into m rows 620 and l redundant rows per column 630. The value m could be any number of rows that are designed to be part of the memory array. The other portion divided by 610 is the redundant rows per column. In some embodiments, there are l redundant rows 630. The value l may be determined to best assist in improving the yield of the memory array at the cost of layout space on the chip.

Creating a column of rows forms a two-dimensional array of bits. Let this column of rows be a subarray, and the POF of the subarray, $P_{BSA}$, is the probability of any event in any row or rows. FIG. 6 illustrates the column of rows and the row variables m and l.

Using the same probability function, and changing to row variables, $P_{BSA}$ is:

$$P_{BSA} = \sum_{i=l+1}^{m+l} \frac{(m+l)!}{i!((m+l)-i)!} P_R^i (1-P_R)^{m+l-i}$$

In order to determine the yield for the row peripheral and column peripheral, a Replaceable Row and Column Model may be used. In some embodiment, this model may be used to determine the failure for replaceable row circuits 450 and replaceable column circuits 460

The immediate edge of the subarray has replaceable row and column elements. Such elements would be a local row driver or a column sense amplifier, and are replaceable according to the number of redundant rows and/or redundant columns Therefore, in such an example, there is a column of local row drivers (like FIG. 6) and a row of column sense amplifiers (like FIG. 5) that need a model for random defect yield simulation. Let $P_{LRD}$ be the POF of a local row driver, and $P_{CSA}$ be the POF of a column sense amplifier, which are known through the standard model for logic in a random defect analysis. Then let $P_{RRE}$ be the POF of an entire column of replaceable row elements, and $P_{RCE}$ be the POF of an entire row of replaceable column elements. The binomial distribution applies again, paying special attention to the row and column variable switch respectively.

$$P_{RRE} = \sum_{i=l+1}^{m+l} \frac{(m+l)!}{i!((m+l)-i)!} P_{LRD}^i (1-P_{LRD})^{m+l-i}$$

$$P_{RCE} = \sum_{i=k+1}^{n+k} \frac{(n+k)!}{i!((n+k)-i)!} P_{CSA}^i (1-P_{CSA}0^{n+k-i}$$

While replaceable row and column elements aren't part of the array bits, they are so closely tied to the array that they are considered part of the subarray. The complete subarray model $P_{SA}$ accumulates the POFs for $P_{BSA}$, $P_{RRE}$, and $P_{RCE}$ through the sum of the products of the probabilities of fail and the probabilities of no fail. Then through some expansion and reduction:

$$P_{SA} = P_{BSA}P_{RRE}P_{RCE} + P_{RRE}(1-P_{BSA}) + P_{RCE}(1-P_{RRE}) + P_{BSA}(1-P_{RCE})$$

Figure 7:
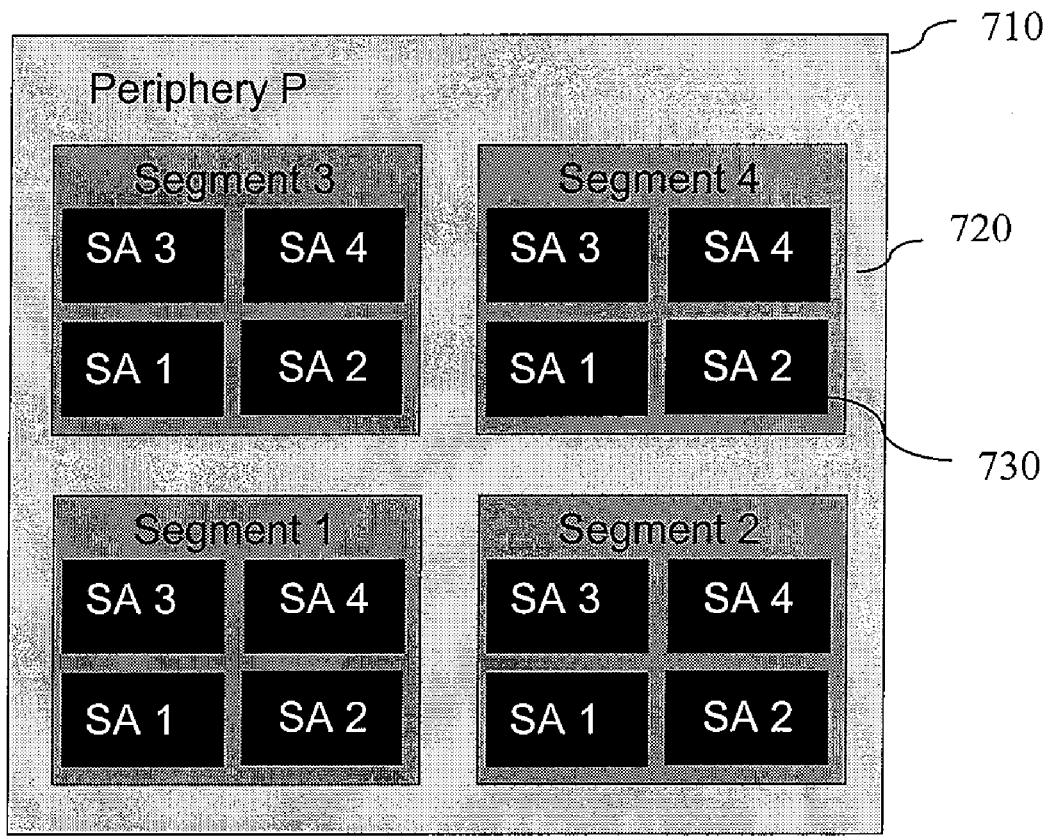
FIG. 7 illustrates a memory block according to an embodiment of the invention.

FIG. 7 illustrates a memory block according to an embodiment of the invention. In one embodiment, FIG. 7 is architecture for memory chip M. The memory chip M 700 includes Periphery P 710. The memory chip also include a plurality of segments such as segment 4 720. Within each segment there are a plurality of subarrays, such as SA 2 730. The subarrays are typically tiled and combined in the design hierarchy to create the full design.

The failure model for Memory M's periphery P is a straightforward model of a chip or region of a chip without built-in redundancy, with a POF of Pp. Therefore, $P_P$, and $P_{SA}$ accumulate according to the specific architecture of the memory chip for the new failure model for random defect yield simulation. FIG. 4 defines the example architecture for this analysis.

In one embodiment, a hierarchy level may be a segment. The segment may contain four subarrays. $P_{SA}$ accumulates independently to $P_{SEG}$ through the binomial distribution as follows:

$$P_{SEG} = \sum_{i=1}^{4} \frac{4!}{i!(4-i)!} P_{SA}^i (1-P_{SA})^{4-i} = 1 - (1-P_{SA})^4$$

Likewise, the total POF of the four segments ($P_{4SEG}$) accumulates as follows:

$$P_{4SEG} = \sum_{i=1}^{4} \frac{4!}{i!(4-i)!} P_{SEG}^i (1-P_{SEG})^{4-i} = 1 - (1-P_{SEG})^4$$

And the POF of Memory M 700 is then:

$$P_M = P_P + P_{4SEG} - P_P P_{4SEG}$$

The embodiments may be used for any type of design activities, including hardware design, software design, and designs including both hardware and software such as hardware/software co-design activities. For example, some embodiments of the invention may be applied to the design of embedded software and systems, which includes graphical processors, central processing units, computers, as well as any other systems that include embedded software.

Figure 8:
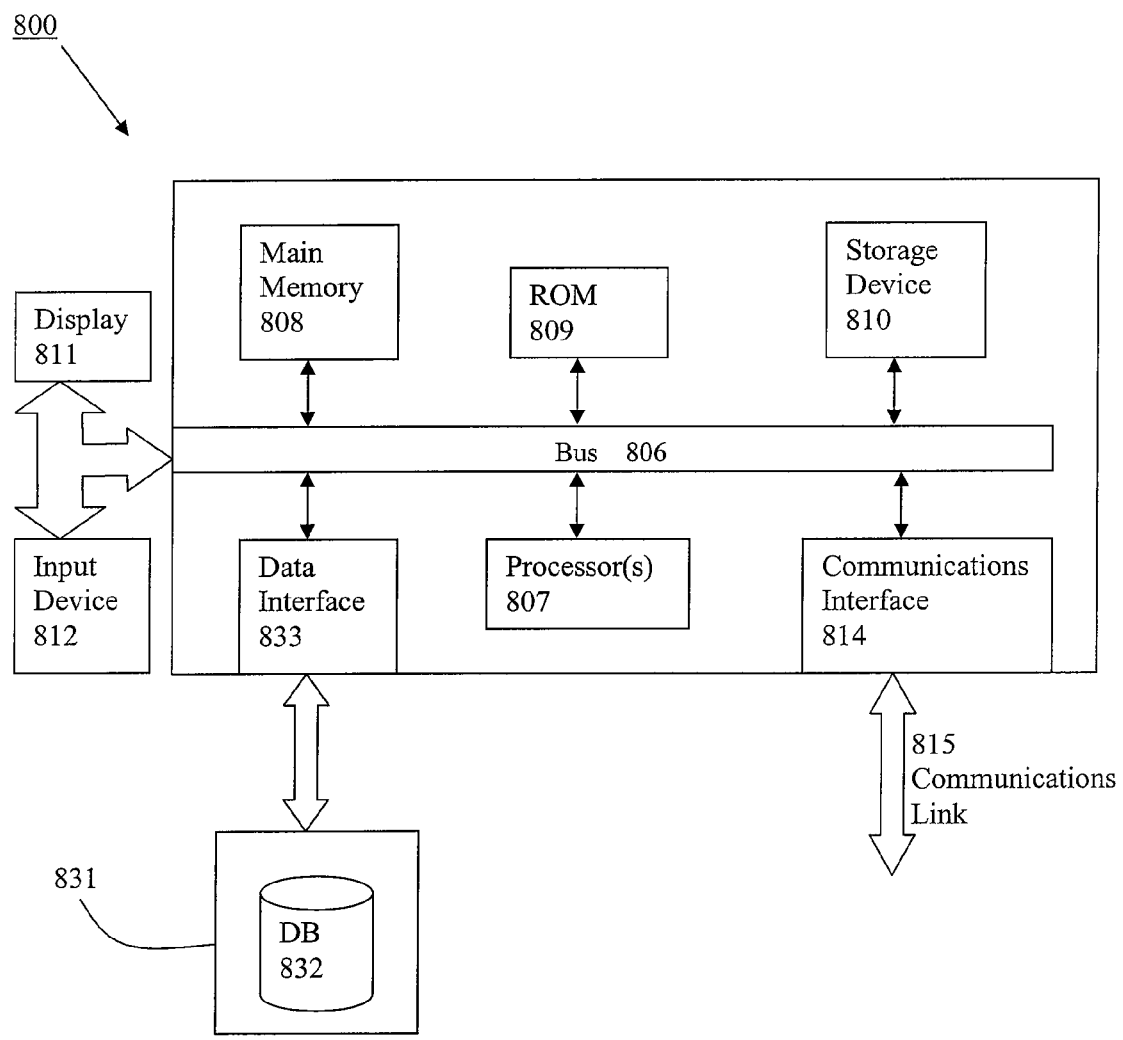
FIG. 8 depicts a computerized system on which a method for verification based on rules and models can be implemented.

FIG. 8 depicts a computerized system on which a method for random defect yield simulation of electronic design with built-in redundancy may be implemented. The execution of the sequences of instructions required to practice the embodiments may be performed by a computer system 800 as shown in FIG. 8. In an embodiment, execution of the sequences of instructions is performed by a single computer system 800. According to other embodiments, two or more computer systems 800 coupled by a communication link 815 may perform the sequence of instructions in coordination with one another. Although a description of only one computer system 800 will be presented below, however, it should be understood that any number of computer systems 800 may be employed to practice the embodiments.

A computer system 800 according to an embodiment will now be described with reference to FIG. 8, which is a block diagram of the functional components of a computer system 800. As used herein, the term computer system 800 is broadly used to describe any computing device that may store and independently run one or more programs.

Each computer system 800 may include a communication interface 814 coupled to the bus 806. The communication interface 814 provides two-way communication between computer systems 800. The communication interface 814 of a respective computer system 800 transmits and receives electrical, electromagnetic or optical signals, which include data streams representing various types of signal information, e.g., instructions, messages and data. A communication link 815 links one computer system 800 with another computer system 800. For example, the communication link 815 may be a LAN, in which case the communication interface 814 may be a LAN card, or the communication link 815 may be a PSTN, in which case the communication interface 814 may be an integrated services digital network (ISDN) card or a modem, or the communication link 815 may be the Internet, in which case the communication interface 814 may be a dial-up, cable or wireless modem.

A computer system 800 may transmit and receive messages, data, and instructions, including program, i.e., application, code, through its respective communication link 815 and communication interface 814. Received program code may be executed by the respective processor(s) 807 as it is received, and/or stored in the storage device 810, or other associated non-volatile media, for later execution.

In an embodiment, the computer system 800 operates in conjunction with a data storage system 831, e.g., a data storage system 831 that contain a database 832 that is readily accessible by the computer system 800. The computer system 800 communicates with the data storage system 831 through a data interface 833. A data interface 833, which is coupled to the bus 806, transmits and receives electrical, electromagnetic or optical signals, which include data streams representing various types of signal information, e.g., instructions, messages and data. In embodiments, the functions of the data interface 833 may be performed by the communication interface 814.

Computer system 800 includes a bus 806 or other communication mechanism for communicating instructions, messages and data, collectively, information, and one or more processors 807 coupled with the bus 806 for processing information. Computer system 800 also includes a main memory 808, such as a random access memory (RAM) or other dynamic storage device, coupled to the bus 806 for storing dynamic data and instructions to be executed by the processor(s) 807. The main memory 808 also may be used for storing temporary data, i.e., variables, or other intermediate information during execution of instructions by the processor(s) 807.

The computer system 800 may further include a read only memory (ROM) 809 or other static storage device coupled to the bus 806 for storing static data and instructions for the processor(s) 807. A storage device 810, such as a magnetic disk or optical disk, may also be provided and coupled to the bus 806 for storing data and instructions for the processor(s) 807.

A computer system 800 may be coupled via the bus 406 to a display device 811, such as, but not limited to, a cathode ray tube (CRT), for displaying information to a user. An input device 812, e.g., alphanumeric and other keys, is coupled to the bus 806 for communicating information and command selections to the processor(s) 807.

According to one embodiment, an individual computer system 800 performs specific operations by their respective processor(s) 807 executing one or more sequences of one or more instructions contained in the main memory 808. Such instructions may be read into the main memory 408 from another computer-usable medium, such as the ROM 809 or the storage device 810. Execution of the sequences of instructions contained in the main memory 808 causes the processor(s) 807 to perform the processes described herein. In alternative embodiments, hard-wired circuitry may be used in place of or in combination with software instructions. Thus, embodiments are not limited to any specific combination of hardware circuitry and/or software.

The term "computer-usable medium," as used herein, refers to any medium that provides information or is usable by the processor(s) 807. Such a medium may take many forms, including, but not limited to, non-volatile, volatile. Non-volatile media, i.e., media that may retain information in the absence of power, includes the ROM 809, CD ROM, magnetic tape, and magnetic discs. Volatile media, i.e., media that cannot retain information in the absence of power, includes the main memory 808.

In the foregoing specification, the embodiments have been described with reference to specific elements thereof. It will, however, be evident that various modifications and changes may be made thereto without departing from the broader spirit and scope of the embodiments. For example, the reader is to understand that the specific ordering and combination of process actions shown in the process flow diagrams described herein is merely illustrative, and that using different or additional process actions, or a different combination or ordering of process actions can be used to enact the embodiments. The specification and drawings are, accordingly, to be regarded in an illustrative rather than in a restrictive sense.

What is claimed is:

1. A method comprising:
providing a simulation model to determine a random yield for a layout design, wherein the layout design includes a memory array with one or more redundant rows or columns, wherein the simulation model comprises a failure model for the memory array;
determining a probability of failure of the memory array of the layout design, wherein the probability of failure of the memory array comprises accumulating a probability of failure of a two-dimensional array of bits, a probability of failure of a column of replaceable row elements and a probability of failure of a row of replaceable column elements through a sum of products of probabilities of fail and probabilities of no fail; and
calculating, by using a processor, the random yield for the layout design based at least in part upon the accumulated probabilities of failure.

2. The method of claim 1, wherein the failure model comprises at least one of a failure model for a periphery of the memory array, a failure model for the array elements of the memory array, a failure model for the replaceable row elements, or a failure model for the replaceable column elements.

3. The method of claim 2, wherein a the failure model for the row elements is given by a probability function comprising:

$$P_R = \sum_{i=k+1}^{n+k} \frac{(n+k)!}{i!((n+k)-i)!} P_B^i (1-P_B)^{n+k-i}$$

wherein the $P_B$ represents a probability of bit failure, the $P_R$ represents a probability of row failure and i, k and n are integers.

4. The method of claim 1, wherein a probability of failure for a subarray model is determined with the simulation model comprising:

$$P_{SA} = P_{BSA} P_{RRE} P_{RCE} + P_{RRE}(1-P_{BSA}) + P_{RCE}(1-P_{RRE}) + P_{BSA}(1-P_{RCE})$$

Wherein the $P_{SA}$ represents the probability of failure for the subarray model, the $P_{BSA}$ represents the probability of failure of the two-dimensional array of bits, the $P_{RRE}$ represents the probability of failure of the column of the replaceable row elements and the $P_{RCE}$ represents the probability of failure of the row of replaceable the column elements.

5. The method of claim 1, wherein the random yield comprises a random defect yield.

6. The method of claim 1, wherein the layout design includes an electronic design.

7. An apparatus comprising:
a processor programmed for:
providing a simulation model to determine a random yield for a layout design, wherein the layout design includes a memory array with redundant row or column, wherein the simulation model comprises a failure model for the memory array;
determining a probability of failure of the memory array of the layout design, wherein the probability of failure of the memory array comprises accumulating a probability of failure of a two-dimensional array of bits, a probability of failure of a column of replaceable row elements and a probability of failure of a row of replaceable column elements through a sum of products of probabilities of fail and probabilities of no fail; and
calculating the random yield for the layout design based at least in part upon the accumulated probabilities of failure.

8. The apparatus of claim 7, wherein the failure model comprises at least one of a failure model for a periphery of the memory array, a failure model for the array elements of the memory array, a failure model for the replaceable row elements, or a failure model for the replaceable column elements.

9. The apparatus of claim 7, wherein the random yield comprises a random defect yield.

10. The apparatus of claim 7, wherein the layout design includes an electronic design.

11. The apparatus of claim 7, wherein a probability of failure for a subarray model is determined with the simulation model comprising:

$$P_{SA} = P_{BSA} P_{RRE} P_{RCE} + P_{RRE}(1-P_{BSA}) + P_{RCE}(1-P_{RRE}) + P_{BSA}(1-P_{RCE})$$

Wherein the $P_{SA}$ represents the probability of failure for the subarray model, the $P_{BSA}$ represents the probability of failure of the two-dimensional array of bits, the $P_{RRE}$ represents the probability of failure of the column of the replaceable row elements and the $P_{RCE}$ represents the probability of failure of the row of replaceable the column elements.

12. A computer program product comprising a volatile or non-volatile computer-user medium having a set of stored instructions, an execution of which by a processor causes a process to be performed, the process comprising:

providing a simulation model to determine a random yield for a layout design, wherein the layout design includes a memory array with redundant row or column, wherein the simulation model comprises a failure model for the memory array;

determining a probability of failure of the memory array of the layout design, wherein the probability of failure of the memory array comprises accumulating a probability of failure of a two-dimensional array of bits, a probability of failure of a column of replaceable row elements and a probability of failure of a row of replaceable column elements through a sum of products of probabilities of fail and probabilities of no fail; and calculating, by one or more processors, the random yield for the layout design based at least in part upon the accumulated probabilities of failure.

13. The product of claim 12, wherein the failure model comprises at least one of a failure model for a periphery of the memory array, a failure model for the array elements of the memory array, a failure model for the replaceable row elements, or a failure model for the replaceable column elements.

14. The product of claim 12, wherein the random yield comprises a random defect yield.

15. The product of claim 12, wherein the layout design includes an electronic design.

16. The product of claim 12, wherein a probability of failure for a subarray model is determined with the simulation model comprising:

$$P_{SA}=P_{BSA}P_{RRE}P_{RCE}+P_{RRE}(1-P_{BSA})+P_{RCE}(1-P_{RRE})+P_{BSA}(1-P_{RCE})$$

Wherein the $P_{SA}$ represents the probability of failure for the subarray model, the $P_{BSA}$ represents the probability of failure of the two-dimensional array of bits, the $P_{RRE}$ represents the probability of failure of the column of the replaceable row elements and the $P_{RCE}$ represents the probability of failure of the row of replaceable the column elements.

* * * * *